US012800292B2

(12) United States Patent
McGahan et al.

(10) Patent No.: US 12,800,292 B2
(45) Date of Patent: Nov. 17, 2026

(54) SPECTROSCOPIC REFLECTOMETRY AND ELLIPSOMETRY MEASUREMENTS WITH ELECTROREFLECTANCE MODULATION

(71) Applicant: KLA Corporation, Milpitas, CA (US)

(72) Inventors: William McGahan, Spicewood, TX (US); Shankar Krishnan, Cupertino, CA (US)

(73) Assignee: KLA Corporation, Milpitas, CA (US)

( * ) Notice: Subject to any disclaimer, the term of this patent is extended or adjusted under 35 U.S.C. 154(b) by 493 days.

(21) Appl. No.: 17/956,643

(22) Filed: Sep. 29, 2022

(65) Prior Publication Data

US 2023/0109008 A1 Apr. 6, 2023

Related U.S. Application Data

(60) Provisional application No. 63/252,216, filed on Oct. 5, 2021.

(51) Int. Cl.
*G01B 11/06* (2006.01)
*G03F 7/00* (2006.01)

(52) U.S. Cl.
CPC ...... *G01B 11/0641* (2013.01); *G03F 7/70625* (2013.01); *G01B 2210/56* (2013.01)

(58) Field of Classification Search
CPC ............ G01B 11/0641; G01B 2210/56; G03F 7/70625; G01N 21/1717; G01N 21/956;
(Continued)

(56) References Cited

U.S. PATENT DOCUMENTS

| | | | | |
|---|---|---|---|---|
| 4,142,802 A | | 3/1979 | Pollak et al. | |
| 4,218,143 A | * | 8/1980 | Bottka ............... | G01R 31/2656 257/190 |

(Continued)

FOREIGN PATENT DOCUMENTS

| | | |
|---|---|---|
| JP | 09-033545 A | 2/1997 |
| JP | 2003-262566 A | 9/2003 |
| WO | 2006111942 A1 | 10/2006 |

OTHER PUBLICATIONS

Lemaillet, Germer, Kline et al., "Intercomparison between optical and x-ray scatterometry measurements of FinFET structures" by Proc. SPIE, v.8681, p. 86810Q (2013).

(Continued)

*Primary Examiner* — Michelle M Iacoletti
*Assistant Examiner* — Maher Yazback
(74) *Attorney, Agent, or Firm* — Spano Law Group

(57) ABSTRACT

Methods and systems for performing optical measurements of semiconductor structures while modulating both an electric field within one or more structures under measurement and the measurement light employed to measure the one or more structures are presented herein. Spectroscopic ellipsometry, spectroscopic reflectometry, and angle resolved spectroscopic reflectometry measurements are enhanced by modulation of the electric field of the structures under measurement. The modulation of the electric field changes the dielectric function of the materials under measurement. Measurements are performed with an enriched data set including measurement signals collected from one or more structures under time varying optical and electric field conditions. This reduces parameter correlation among floating measurement parameters and improves measurement accuracy. Differences between frequencies of optical modulation and electric field modulation increase the contrast
(Continued)

within the one or more structures under measurement, which, in turn, increases measurement accuracy with reduced computational effort.

25 Claims, 5 Drawing Sheets

(58) Field of Classification Search
CPC ..... G01N 2021/1721; G01N 2021/213; G01N 21/211; H01L 22/12
See application file for complete search history.

(56) References Cited

U.S. PATENT DOCUMENTS 4,446,719 A * 5/1984 Lambert ............ G01N 21/1717 250/341.8
5,287,169 A * 2/1994 Pollak ................ G01N 21/1717 250/226
5,608,526 A 3/1997 Piwonka-Corle et al.
5,851,842 A 12/1998 Katsumata et al.
5,859,424 A 1/1999 Norton et al.
5,991,044 A * 11/1999 Zhang ................ G01N 21/1717 356/417
6,023,338 A 2/2000 Bareket
6,362,881 B1 3/2002 Pickering et al.
6,429,943 B1 8/2002 Opsal et al.
6,716,646 B1 4/2004 Wright et al.
6,734,967 B1 5/2004 Piwonka-Corle et al.
6,778,275 B2 8/2004 Bowes
6,787,773 B1 9/2004 Lee
6,992,764 B1 1/2006 Yang et al.
7,012,438 B1 * 3/2006 Miller ..................... H01L 22/12 324/452
7,239,392 B2 7/2007 Chism, II
7,242,477 B2 7/2007 Mieher et al.
7,280,208 B2 * 10/2007 Funakubo ............ G01N 21/211 356/364
7,321,426 B1 1/2008 Poslavsky et al.
7,406,153 B2 7/2008 Berman
7,478,019 B2 1/2009 Zangooie et al.
7,580,138 B2 8/2009 Price
7,626,702 B2 12/2009 Ausschnitt et al.
7,656,528 B2 2/2010 Abdulhalim et al.
7,826,071 B2 11/2010 Shchegrov et al.
7,842,933 B2 11/2010 Shur et al.
7,873,585 B2 1/2011 Izikson
7,929,667 B1 4/2011 Zhuang et al.
7,933,026 B2 4/2011 Opsal et al.
8,068,662 B2 11/2011 Zhang et al.
8,138,498 B2 3/2012 Ghinovker
8,300,227 B2 * 10/2012 Chism, II ................ H01L 22/14 356/445
9,291,554 B2 3/2016 Kuznetsov et al.
9,310,250 B1 * 4/2016 Bullock ............ G01N 21/8806
9,347,872 B1 * 5/2016 Poslavsky ............ G01N 21/211
9,640,449 B2 5/2017 Goodwin et al.
9,826,614 B1 11/2017 Bakeman et al.
9,885,962 B2 2/2018 Veldman et al.
9,915,522 B1 3/2018 Jiang et al.
10,013,518 B2 7/2018 Bakeman et al.
10,101,670 B2 10/2018 Pandev et al.
10,152,678 B2 12/2018 Pandev et al.
10,324,050 B2 6/2019 Hench et al.
10,352,695 B2 7/2019 Dziura et al.
10,690,602 B2 6/2020 Sapiens et al.
10,962,470 B1 * 3/2021 Saraf .................. G01N 27/3276
11,615,941 B2 * 3/2023 Brouk ............... H01J 37/32174 315/111.21
2003/0021465 A1 1/2003 Adel et al.
2006/0098198 A1 * 5/2006 Chism, II ........... G01N 21/1717 356/369
2007/0176128 A1 8/2007 Van Bilsen et al.
2007/0221842 A1 9/2007 Morokuma et al.
2009/0152463 A1 6/2009 Toyoda et al.
2011/0266440 A1 11/2011 Boughorbel et al.
2012/0292502 A1 11/2012 Langer et al.
2013/0208279 A1 8/2013 Smith
2013/0245985 A1 * 9/2013 Flock ..................... G05B 23/00 702/105
2013/0304424 A1 11/2013 Bakeman et al.
2014/0019097 A1 1/2014 Bakeman et al.
2014/0064445 A1 3/2014 Adler
2014/0111791 A1 4/2014 Manassen et al.
2014/0172394 A1 6/2014 Kuznetsov et al.
2014/0222380 A1 8/2014 Kuznetsov et al.
2014/0297211 A1 10/2014 Pandev et al.
2015/0046121 A1 2/2015 Dziura et al.
2015/0110249 A1 4/2015 Bakeman et al.
2015/0117610 A1 4/2015 Veldman et al.
2015/0204664 A1 7/2015 Bringoltz et al.
2015/0285749 A1 10/2015 Moncton et al.
2015/0300965 A1 10/2015 Sezginer et al.
2016/0202193 A1 7/2016 Hench et al.
2016/0320319 A1 11/2016 Hench et al.
2017/0167862 A1 6/2017 Dziura et al.
2017/0234792 A1 8/2017 Ito et al.
2018/0106735 A1 4/2018 Gellineau et al.
2018/0113084 A1 4/2018 Hench et al.
2018/0328868 A1 11/2018 Bykanov et al.
2019/0017946 A1 1/2019 Wack et al.
2019/0293578 A1 9/2019 Gellineau
2020/0025554 A1 1/2020 Gellineau et al.
2020/0200525 A1 * 6/2020 Chouaib ................. H01L 22/12
2021/0207956 A1 7/2021 Shchegrov et al.
2022/0082515 A1 * 3/2022 Yun .................... G01N 23/2273
2022/0364850 A1 * 11/2022 Adler ................. G01B 11/0608
2023/0105985 A1 * 4/2023 Teng ....................... G02F 1/292 359/318

OTHER PUBLICATIONS

Kline et al., “X-ray scattering critical dimensional metrology using a compact x-ray source for next generation semiconductor devices,” J. Micro/Nanolith. MEMS MOEMS 16(1), 014001 (Jan.-Mar. 2017).
Kudrawiec, Robert, et al., “Electromodulation spectroscopy of highly mismatched alloys,” J. Appl. Phys. 126, 141102, (2019).
Kanazawa, Hideyuki, et al., “Spectroellipsometry and electroreflectance of PbS,” Journal of Applied Physics 84, 5342 (1998).
Peng, Chubing, et al., “Determination of optical constants of thin films and multilayer stacks by use of concurrent reflectance, transmittance, and ellipsometric measurements,” Applied Optics, vol. 40, Issue 28, pp. 5088-5099 (2001).
Erman, M., et al., “Electronic states and thicknesses of GaAs/GaAlAs quantum wells as measured by electroreflectance and spectroscopic ellipsometry,” Journal of Applied Physics 56, 3241 (1984).
Buckman, A.B., et. al., “Electroreflectance Changes in Dielectric Constants of Au and Ag by Modulated ellipsometry,” Phys. Rev. 174, 719, Oct. 15, 1968.
International Search Report mailed on Jan. 31, 2023, for PCT Application No. PCT/US2022/045487 filed on Oct. 3, 2022 by KLA Corporation, 3 pages.

* cited by examiner

SPECTROSCOPIC REFLECTOMETRY AND ELLIPSOMETRY MEASUREMENTS WITH ELECTROREFLECTANCE MODULATION

CROSS REFERENCE TO RELATED APPLICATION

The present application for patent claims priority under 35 U.S.C. § 119 from U.S. provisional patent application Ser. No. 63/252,216, entitled "Electroreflectance (ER) modulation of Spectroscopic Ellipsometry and Spectroscopic Reflectometry," filed Oct. 5, 2021, the subject matter of which is incorporated herein by reference in its entirety.

TECHNICAL FIELD

The described embodiments relate to metrology systems and methods, and more particularly to methods and systems for improved measurement of structures fabricated in the semiconductor industry.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. Model-based metrology techniques offer the potential for high throughput without the risk of sample destruction. A number of model-based metrology based techniques including scatterometry, ellipsometry, and reflectometry implementations and associated analysis algorithms are commonly used to characterize critical dimensions, film thicknesses, composition, overlay and other parameters of nanoscale structures.

Many next generation logic and foundry devices require fabrication of nanosheet structures. In many examples, nanosheet structures are based on a Gate-All-Around (GAA) architecture including alternating layers of Silicon or Silicon-Germanium layers. The small scale and geometric complexity of these structures poses significant metrology challenges.

Traditional model-based optical spectroscopy measurements of GAA structures have proven costly both in time and computational effort. In other examples, machine learning based models have been employed to filter measured spectral signals. Unfortunately, the measurement results suffer from a lack of accuracy.

In general, semiconducting materials typically exhibit strong dispersive features in spectral measurements of optical constants due to various electronic transitions. These features are known as critical points. These critical point features are functions of composition, strain, and internal electric field. Changes in critical point dispersion are significantly different depending on whether the change is induced by changes in composition, strain, and electric field.

Electroreflectance (ER) spectroscopy is a promising technology to address the measurement challenges of GAA structures because semiconductor materials exhibit critical points in their band structure, and these critical points are sensitive to changes in electric field.

Electroreflectance (ER) spectroscopy is a type of modulation spectroscopy, in which periodic changes are induced in the electric field of the sample under test. The oscillating electric field induces derivative-like features in the measured optical response. The modulation of the electric field effectively causes a modulation of the dielectric function of the sample materials at the same frequency. The measured signal is typically expressed as the change in reflectivity, $\Delta R$, divided by the nominal reflectivity, R. The measurement signal, $\Delta R/R$, exhibits features associated with various electronic transitions in the sample materials. In one example, the measurement signal, $\Delta R/R$, is highly sensitive to the band structure of the sample materials.

The measurement of ER spectra, particularly in conjunction with normal spectroscopic reflectance and ellipsometry measurements, has significant potential for the measurement of composition and strain in Si/SiGe stacks and other alloy semiconductors (III/V compounds, II/VI compounds, etc.).

In many existing systems, ER spectroscopy is performed by modulating the intensity of a pump beam delivered to a measurement site while performing measurements of light reflected or scattered from the sample in response to a probe beam, e.g., spectral reflectometry. In some examples, the pump beam and the probe beam are the same beams. The modulated pump beam induces a change in the electric field in the sample, which in turn, modulates the optical response of the sample under measurement. In these examples, changes in the electric field within the sample are induced by incident photons from the pump beam.

Optically pumping the sample to induce changes in the electric field is limited. Excessive optical intensity risks damaging the sample and introduces the potential for signal contamination at the detector. Furthermore, optical pumping is limited in its ability to alter the electric field deep into the sample. These factors contribute to a reduction in the effectiveness of photon induced ER spectroscopy for the measurement of GAA structures.

Future metrology applications present challenges due to increasingly small resolution requirements, multi-parameter correlation, increasingly complex geometric structures, and increasing use of opaque materials. Thus, methods and systems for improved measurements are desired, and in particular, improved measurements of GAA structures.

SUMMARY

Methods and systems for performing optical measurements of semiconductor structures while modulating both an electric field within one or more structures under measurement and the measurement light employed to measure the one or more structures are presented herein. The modulation of the electric field changes the dielectric function of the materials under measurement. The frequencies of optical modulation and electric field modulation are different, and these differences are employed to increase the contrast within the one or more structures under measurement. Measurements are performed with an enriched data set including measurement signals collected from one or more structures under time varying optical and electric field conditions. This reduces parameter correlation among floating measurement parameters and improves measurement accuracy. Thus, sufficiently accurate measurement results can be obtained, and often with reduced computational effort.

A number of optical measurement techniques are enhanced by modulation of the electric field of the structures under measurement, including, but not limited to spectroscopic ellipsometry, spectroscopic reflectometry, angle resolved spectroscopic reflectometry, etc. The increase in contrast enables accurate measurements of Gate All Around (GAA) semiconductor structures and other compound semiconductor structures including III-V materials. Exemplary structures include, but are not limited to thin films, thick films, critical dimensions, and overlay. Furthermore, the increase in contrast enables accurate measurements of alloy concentration and material composition measurements.

In some embodiments, the electric field is modulated over a large range of frequencies. In some examples, the parameter of interest is a band structure resonance of the structure under measurement. In these examples, it may be advantageous to modulate the electric field at a frequency close to an expected resonance frequency of the band structure. Similarly, it may be advantageous to modulate the measurement light, e.g., polarization frequency, at a frequency close to an expected resonance frequency of the band structure. In general, it is advantageous to generate separation between the effects of electric field modulation and measurement light modulation in the frequency domain to increase measurement accuracy.

In general, parameters of interest may be estimated based on measurement data collected while the electric field is varied at a single frequency, or alternatively, parameters of interest may be estimated based on measurement data collected while the electric field is varied at multiple, different frequencies in a sequential manner. In some other embodiments, parameters of interest may be estimated based on measurement data collected while the electric field is simultaneously varied at multiple, different frequencies.

An electrode of an electric field modulation subsystem facing the top surface of a wafer may be shaped in any suitable manner to avoid optically interfering with the propagation of the illumination and collection light of the measurement system.

In some embodiments, the top electrode is fabricated entirely, or in part, with an optically transparent, electrically conductive material. In these embodiments, the top electrode may be located in the optical path of the measurement system.

In some other embodiments, the top electrode is fabricated with an electrically conductive material, but is not located in the optical path of the measurement system.

In some other embodiments, the top electrode is fabricated with an electrically conductive material and includes an aperture through which the illumination and collection light passes without interference.

In some other embodiments, the top electrode is fabricated with an electrically conductive material and includes a reflective surface facing the top surface of the wafer under measurement. Illumination and collection light reflect from the reflective surface while propagating to and from the surface of the wafer.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Methods and systems for performing optical measurements of semiconductor structures while modulating both an electric field within one or more structures under measurement and the measurement light employed to measure the one or more structures are presented herein. The modulation of the electric field changes the dielectric function of the materials under measurement. The frequencies of optical modulation and electric field modulation are different, and these differences are employed to increase the contrast within the one or more structures under measurement. Measurements are performed with an enriched data set including measurement signals collected from one or more structures under time varying optical and electric field conditions. This reduces parameter correlation among floating measurement parameters and improves measurement accuracy. Thus, sufficiently accurate measurement results can be obtained, and often with reduced computational effort.

A number of optical measurement techniques are enhanced by modulation of the electric field of the structures under measurement, including, but not limited to spectroscopic ellipsometry, spectroscopic reflectometry, angle resolved spectroscopic reflectometry, etc. The increase in contrast enables accurate measurements of Gate All Around (GAA) semiconductor structures and other compound semiconductor structures including III-V materials. Exemplary structures include, but are not limited to thin films, thick films, critical dimensions, and overlay. Furthermore, the increase in contrast enables accurate measurements of alloy concentration and material composition measurements.

Figure 1:
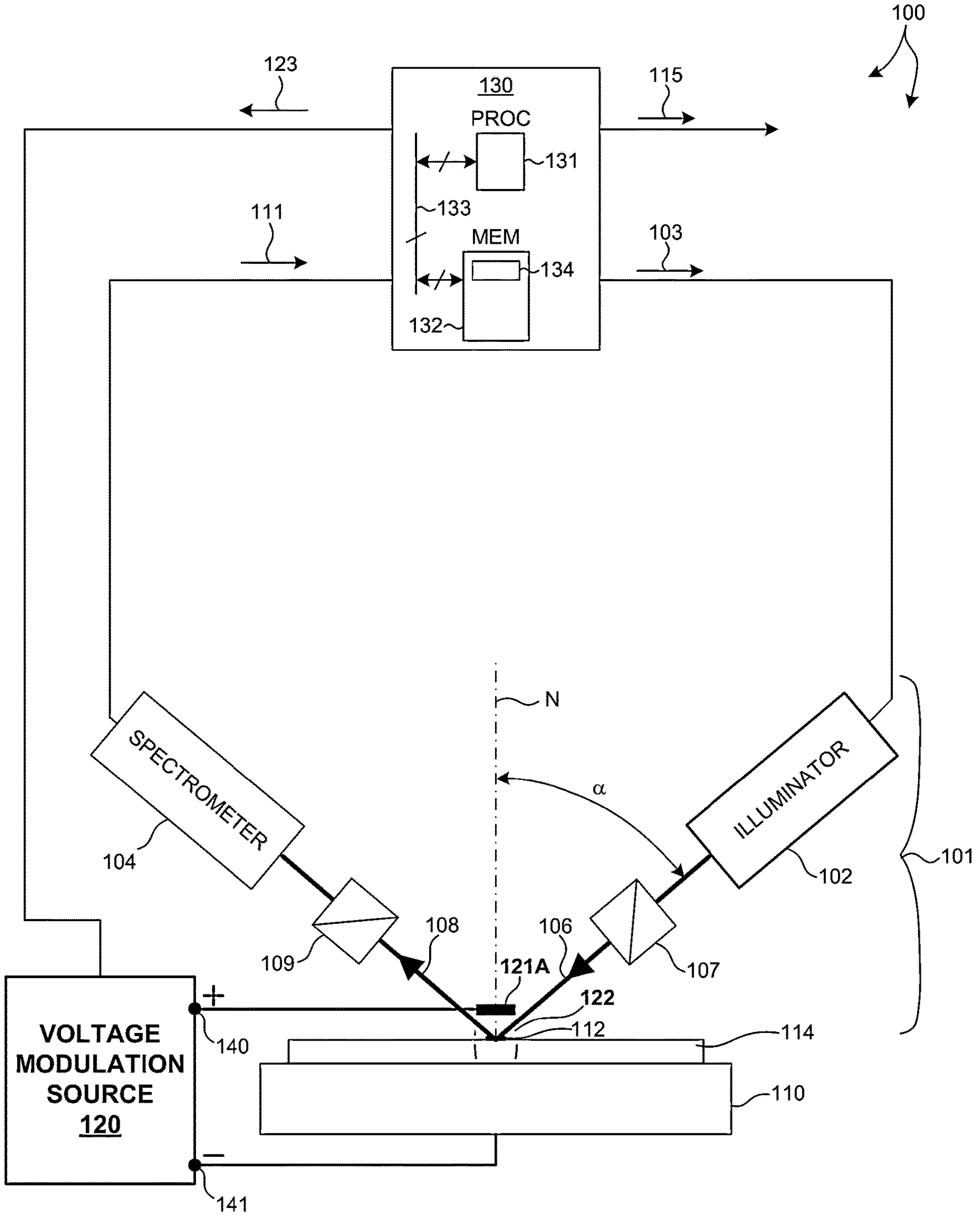
FIG. 1 is a diagram illustrative of a system 100 for performing spectroscopic ellipsometry measurements of one or more structures disposed on a semiconductor wafer while modulating an electric field within the one or more structures under measurement.

FIG. 1 illustrates a system 100 for measuring characteristics of a semiconductor wafer. As shown in FIG. 1, system 100 performs spectroscopic ellipsometry measurements of one or more structures 112 disposed on a semiconductor wafer 114 while modulating an electric field within the one or more structures under measurement. In this aspect, system 100 includes a spectroscopic ellipsometer 101 equipped with an illuminator 102 and a spectrometer 104. The illuminator 102 of the system 100 is configured to generate and direct illumination of a selected wavelength range (e.g., 100 nanometers –20micrometers) to the one or more structures 112 disposed on the surface of the semiconductor wafer 114 in response to command signals 103 communicated from computing system 130 to illuminator 102. In turn, the spectrometer 104 is configured to receive light from the surface of the semiconductor wafer 114. It is further noted that the light emerging from the illuminator 102 is polarized using a polarization state generator 107 to produce a polarized illumination beam 106. The radiation reflected by the structure 114 disposed on the wafer 112 is passed through a polarization state analyzer 109 and to the spectrometer 104. The radiation received by the spectrometer 104 in the collection beam 108 is analyzed with regard to polarization state, allowing for spectral analysis of radiation passed by the analyzer. The detected spectra 111 are passed to the computing system 130 for analysis of the one or more structures 112.

As depicted in FIG. 1, metrology system 100 includes an electric field modulation subsystem configured to generate a modulated electric field within a volume that includes one or more structures 112 during measurement. As depicted in FIG. 1, the electric field modulation subsystem includes two electrodes electrically coupled to a voltage modulation source 120. Voltage modulation source 120 receives command signals 123 from computing system 130. Command signals 123 include an indication of a desired modulation frequency or set of modulation frequencies. In response to command signal 123, voltage modulation source 120 generates a modulated high voltage electrical signal across voltage nodes 140 and 141. As depicted in FIG. 1, voltage node 140 is electrically coupled to electrode 121A located above and spaced apart from wafer 114. Similarly, voltage node 141 is electrically coupled to an electrically conductive wafer chuck 110, which is, in turn, electrically coupled to the backside of wafer 114. In these embodiments, wafer chuck 110 acts as an electrode in electrical contact with the bottom surface of wafer 110. The presence of a modulated high voltage electrical signal across voltage nodes 140 and 141 induces a modulated electric field 122 between electrode 121A and the bottom surface of wafer 114 within a volume that includes the one or more structures 112 under measurement.

As described hereinbefore, voltage modulation source 120 generates a modulated high voltage electrical signal across voltage nodes 140 and 141 to generate a time varying electric field in a volume including the structures under measurement. In some embodiments, the amplitude of the high voltage electrical signal is greater than 1 kilovolt, e.g., within a range of 1-100 kilovolts, to induce changes in optical properties within the sensitivity of the measurement system, e.g., spectral ellipsometer 101. As the amplitude of the high voltage electrical signal increases, so does the risk of damaging the wafer by inducing an electrical arc to the top surface of wafer 114. To reduce the risk of arcing, electrode 121A is positioned sufficiently close to the top surface of wafer 114 to achieve the required electric field strength without excessively high voltage. In some embodiments, electrode 121A is located within 10 millimeters of the top surface of wafer 114. In some embodiments, electrode 121A is located within 1 millimeter of the top surface of wafer 114.

In addition, in some embodiments, the measurement system, e.g., spectral ellipsometer 101 is operated in a gas purge environment or a vacuum environment to reduce the risk of damaging the wafer by inducing an electrical arc between the top electrode and the top surface of wafer 114. In some embodiments, a local environment around a structure under measurement is treated with a flow of purge gas. In some other embodiments, the environment around a structure under measurement is operated in vacuum. In this manner, the operating environment, the amplitude of the high voltage electrical signal, and the distance between the top surface of the wafer and the top electrode are selected to ensure the electric field strength required to induce changes in optical properties of the structures under measurement that are within the sensitivity of the measurement system.

As described hereinbefore, the modulated electric field 122 changes the optical properties of the structures under measurement. In some embodiments, the electric field is modulated at any frequency over a large range of frequencies, e.g., 1-1000 Hertz. In some examples, the parameter of interest is a band structure resonance of the structure under measurement. In these examples, it may be advantageous to modulate the electric field at a frequency close to an expected resonance frequency of the band structure. In some examples, a difference between the frequency of electric field modulation and a resonant frequency of a band structure under measurement is less than 20% of the value of the resonant frequency of the band structure. In some examples, a difference between the frequency of electric field modulation and a resonant frequency of a band structure under measurement is less than 2% of the value of the resonant frequency of the band structure.

Similarly, it may be advantageous to modulate the measurement light, e.g., polarization frequency, at a frequency close to an expected resonance frequency of the band structure. In some examples, a difference between the frequency of the modulated measurement light and the resonant frequency of the band structure of the one or more structures under measurement is less than 20% of the value of the resonant frequency of the band structure. In some examples, a difference between the frequency of modulated measurement light and a resonant frequency of a band structure under measurement is less than 2% of the value of the resonant frequency of the band structure.

In a preferred embodiment, the frequency of modulation of the electric field and the frequency of modulation of the measurement light is different. It is advantageous to generate separation between the effects of electric field modulation and measurement light modulation in the frequency domain to increase measurement accuracy. In some preferred embodiments, the frequency of modulation of the electric field and the frequency of modulation of the measurement light are separated by at least 1% of the value of either the frequency of modulation of the electric field or the frequency of modulation of the measurement light.

In some embodiments, voltage modulation source 120 generates a single sinusoidal output at any particular instance, i.e., the modulated high voltage electrical signal across voltage nodes 140 and 141 at any particular instance is sinusoidal with one frequency component. Thus, at any particular instance, the induced electric field 122 is sinusoidal with one frequency component. In these embodiments, measurement data collected at a particular instance is associated with electric field modulation at one sinusoidal frequency. In general, parameters of interest may be estimated based on measurement data collected at a single frequency, or alternatively, parameters of interest may be estimated based on measurement data collected while the electric field is varied at multiple, different frequencies in a sequential manner.

In some other embodiments, voltage modulation source 120 generates an output signal including multiple frequency components, i.e., the modulated high voltage electrical signal across voltage nodes 140 and 141 at any particular instance includes multiple frequency components. In these embodiments, measurement data collected at a particular instance is associated with electric field modulation at multiple frequencies. In general, parameters of interest may be estimated based on measurement data collected while the electric field is varied at multiple, different frequencies in a simultaneous manner. In some of these embodiments, the modulated high voltage electrical signal includes a superposition of multiple sinusoidal signals. In some of these embodiments, the modulated high voltage electrical signal includes a single signal characterized by multiple sinusoidal components, e.g., a square wave signal.

In one aspect, spectral ellipsometry measurements are performed while the electric field of the structures under measurement is modulated. The measurement data collected from the measurements is communicated to computing system 130 and an estimate of one or more structural parameters of interest 115 is made based on the collected measurement data.

Computing system 130 is configured to receive measurement data 111 associated with a measurement (e.g., critical dimension, film thickness, concentration, composition, process, etc.) of one or more structures 112 disposed on wafer 114. In one example, the measurement data 111 includes an indication of the measured spectral response of the specimen by measurement system 100 based on the one or more sampling processes from the spectrometer 104. In some embodiments, computing system 130 is further configured to determine specimen parameter values 115 of structure 112 from measurement data 111. In one example, the computing system 130 is configured to access model parameters in real-time, employing Real Time Critical Dimensioning (RTCD), or it may access libraries of pre-computed models for determining a value of at least one parameter of interest associated with the target structure 112. In some embodiments, the estimated values of the one or more parameters of interest are stored in a memory (e.g., memory 132). In the embodiment depicted in FIG. 1, the estimated values 115 of the one or more parameters of interest are communicated to an external system (not shown).

In general, ellipsometry is an indirect method of measuring physical properties of the specimen under inspection. In most cases, the raw measurement signals (e.g., $\alpha_{meas}$ and $\beta_{meas}$) cannot be used to directly determine the physical properties of the specimen. The nominal measurement process consists of parameterization of the structure (e.g., film thicknesses, critical dimensions, material properties, etc.) and the machine (e.g., wavelengths, angles of incidence, polarization angles, etc.). A measurement model is created that attempts to predict the measured values (e.g., $\alpha_{meas}$ and $\beta_{meas}$). As illustrated in equations (1) and (2), the model includes parameters associated with the machine ($P_{machine}$) and the specimen ($P_{specimen}$).

$$\alpha_{model}=f(P_{machine}, P_{specimen}) \quad (1)$$

$$\beta_{model}=g(P_{machine}, P_{specimen}) \quad (2)$$

Machine parameters are parameters used to characterize the metrology tool (e.g., ellipsometer 101). Exemplary machine parameters include angle of incidence (AOI), analyzer angle ($A_0$), polarizer angle ($P_0$), illumination wavelength, numerical aperture (NA), compensator or waveplate (if present), etc. Specimen parameters are parameters used to characterize the specimen (e.g., wafer 114 including structures 112). For a thin film specimen, exemplary specimen parameters include refractive index, dielectric function tensor, nominal layer thickness of all layers, layer sequence, etc. For a CD specimen, exemplary specimen parameters include geometric parameter values associated with different layers, refractive indices associated with different layers, etc. For measurement purposes, the machine parameters are treated as known, fixed parameters and one or more of the specimen parameters are treated as unknown, floating parameters.

In some examples, the floating parameters are resolved by an iterative process (e.g., regression) that produces the best fit between theoretical predictions and experimental data. The unknown specimen parameters, $P_{specimen}$, are varied and the model output values (e.g., $\alpha_{model}$ and $\beta_{model}$) are calculated until a set of specimen parameter values are determined that results in a close match between the model output values and the experimentally measured values (e.g., $\alpha_{meas}$ and $\beta_{meas}$). In a model based measurement application such as spectroscopic ellipsometry on a CD specimen, a regression process (e.g., ordinary least squares regression) is employed to identify specimen parameter values that minimize the differences between the model output values and the experimentally measured values for a fixed set of machine parameter values.

In some examples, the floating parameters are resolved by a search through a library of pre-computed solutions to find the closest match. In a model based measurement application such as spectroscopic ellipsometry on a CD specimen, a library search process is employed to identify specimen parameter values that minimize the differences between pre-computed output values and the experimentally measured values for a fixed set of machine parameter values.

In a model-based measurement application, simplifying assumptions often are required to maintain sufficient throughput. In some examples, the truncation order of a Rigorous Coupled Wave Analysis (RCWA) must be reduced to minimize compute time. In another example, the number or complexity of library functions is reduced to minimize search time. In another example, the number of floating parameters is reduced by fixing certain parameter values. In some examples, these simplifying assumptions lead to unacceptable errors in the estimation of values of one or more parameters of interest (e.g., critical dimension parameters, overlay parameters, etc.). By performing measurements of structures subject to gaseous adsorption as described herein, the model-based measurement model can be solved with reduced parameter correlations and increased measurement accuracy.

In general, spectroscopic ellipsometer 101 may employ any architecture suitable to measure the modulation of optical properties, e.g., dielectric function, bandgap, etc., induced by the electric field modulation subsystem of measurement system 100. By way of non-limiting example, spectroscopic ellipsometer 101 may be configured with a rotating polarizer, rotating compensator, or any combination thereof.

Furthermore, the embodiments of the system 100 illustrated in FIG. 1 may be further configured as described herein. In addition, the system 100 may be configured to perform any other block(s) of any of the method embodiment(s) described herein.

Figure 2:
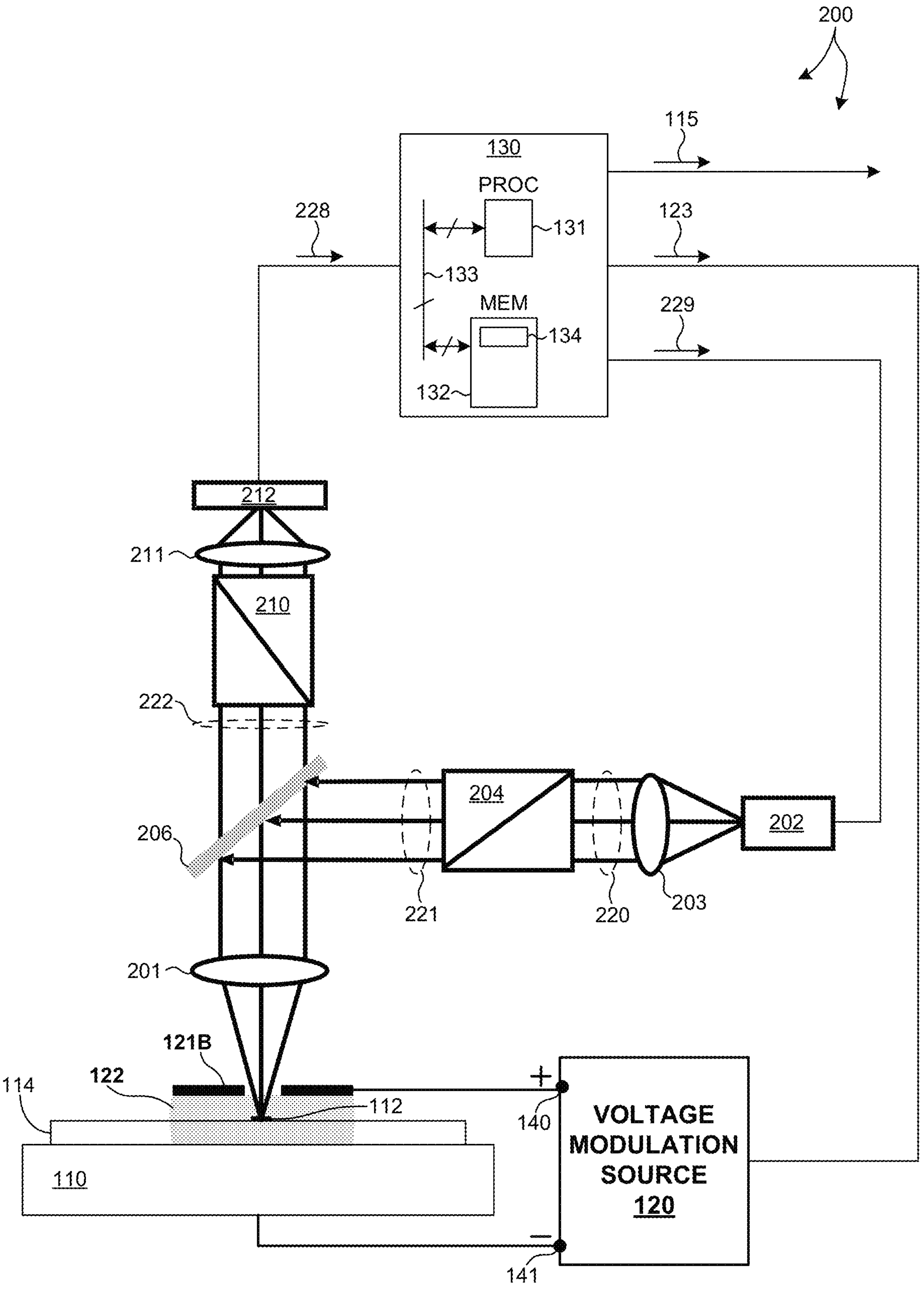
FIG. 2 is a diagram illustrative of a system 200 for performing angle resolved spectroscopic reflectometry measurements of one or more structures disposed on a semiconductor wafer while modulating an electric field within the one or more structures under measurement.

FIG. 2 illustrates an angle-resolved spectral reflectometer system configured to measure reflectivity over a wide angular range to estimate values of one or more characteristics of a semiconductor wafer in at least one novel aspect. Like numbered elements illustrated in FIG. 2 are analogous to those described with reference to FIG. 1. As shown in FIG. 2, system 200 performs angle resolved spectroscopic reflectometry measurements of one or more structures 112 disposed on a semiconductor wafer 114 while modulating an electric field within the one or more structures under measurement. In one embodiment, system 200 is an angle resolved spectroscopic reflectometer including one or more measurement channels spanning a broad wavelength range, e.g., infrared wavelengths between 750 nanometers and 2600 nanometers.

Angle resolved spectroscopic reflectometer 200 includes polarizer 204, objective 201, analyzer 210, and spectrometer 212. As depicted in FIG. 2, an illumination beam is generated by the illumination source 202 in response to command signals 229 received from computing system 130. Light from illumination source 202 is conditioned by optional beam forming optics 203 to generate an illumination light beam 220. Illumination light beam 220 is directed to polarizer 204. Although, as depicted, illumination light directed to polarizer 204 comes from illumination source 202, in general, light from any number of illumination sources of system 200 may be combined to generate an illumination light beam directed to polarizer 204. In this manner, the spectral components of the illumination light can be configured as a combination of light emitted from multiple illumination sources.

In some embodiments, polarizer 204 is configured to selectively rotate a polarizing element about the optical axis of the illumination light beam 220. In general, polarizer 204 may include any polarizing element and system to rotate the polarizing element known in the art. For example, the polarizer 204 may include a polarizing element mechanically coupled to a rotational actuator. In one example, the polarizing element may be a Rochon prism. In another example, the polarizing element may include a beam displacer. Polarizer 204 is configured to operate within system 200 in either a rotationally active or rotationally inactive state. In one instance, a rotational actuator of polarizer 204 may be inactive such that the polarizing element remains rotationally fixed about the optical axis of illumination light 220. In another instance, the rotational actuator may rotate the polarizing element at a selected angular frequency, $\omega_p$, about the optical axis of the illumination light.

In some other embodiments, polarizer 204 is configured with a fixed polarization angle about the optical axis of the illumination light beam 220.

As depicted in FIG. 2, illumination light beam 220 passes through polarizer 204 while the rotational actuator rotates the polarizing element at the selected angular frequency, $\omega_p$. In this manner, polarizer 204 generates a polarized light beam 221 directed toward beamsplitter 206. Beamsplitter 206 directs the polarized light beam 221 towards objective 201.

In the embodiment depicted in FIG. 2, objective 201 focuses polarized light beam 221 the surface of wafer 114 over a range of angles of incidence. In some examples, polarized light beam 221 is focused onto the surface of wafer 114 within a range of angles of incidence between 0 and 40 degrees. In some examples, the polarized light beam 221 is focused onto the surface of wafer 114 at small angles of incidence results in a small illumination spot, e.g., less than 100 micrometers in diameter.

The interaction of the focused, polarized light beam 221 with wafer 114 modifies the polarization of the radiation by any of reflection, scattering, diffraction, transmission, or other types of processes. After interaction with the wafer 114, modified light 222 is collected by objective 201 and directed to beamsplitter 206. Beamsplitter 206 is configured to transmit modified light 222 toward analyzer 210. In the embodiment depicted in FIG. 2, analyzer 210 includes a polarizer element that remains rotationally fixed about the optical axis of modified light beam 222 while the modified light beam 222 passes through the analyzer 210 and optional beam focusing optics 211 to spectrometer 212. In spectrometer 212, the beam components having different wavelengths are refracted (e.g., in a prism spectrometer) or diffracted (e.g., in a grating spectrometer) in different directions to different detectors. The detectors may be a linear array of photodiodes, with each photodiode measuring radiation in a different wavelength range. The radiation received by the spectrometer 212 is analyzed with regard to polarization state, allowing for spectral analysis by the spectrometer of radiation passed by the polarizer 212. The measured spectra 228 are communicated to computing system 130. Computing system 130 is configured to receive signals 228 indicative of the measured spectral response of the structure of interest and estimate values of parameters of interest based on the measured spectral response.

As depicted in FIG. 2, metrology system 200 includes an electric field modulation subsystem configured to generate a modulated electric field within a volume that includes one or more structures 112 under measurement by angle resolved spectroscopic reflectometer system 200 as described with respect to spectroscopic ellipsometer system 100 hereinbefore.

Figure 3:
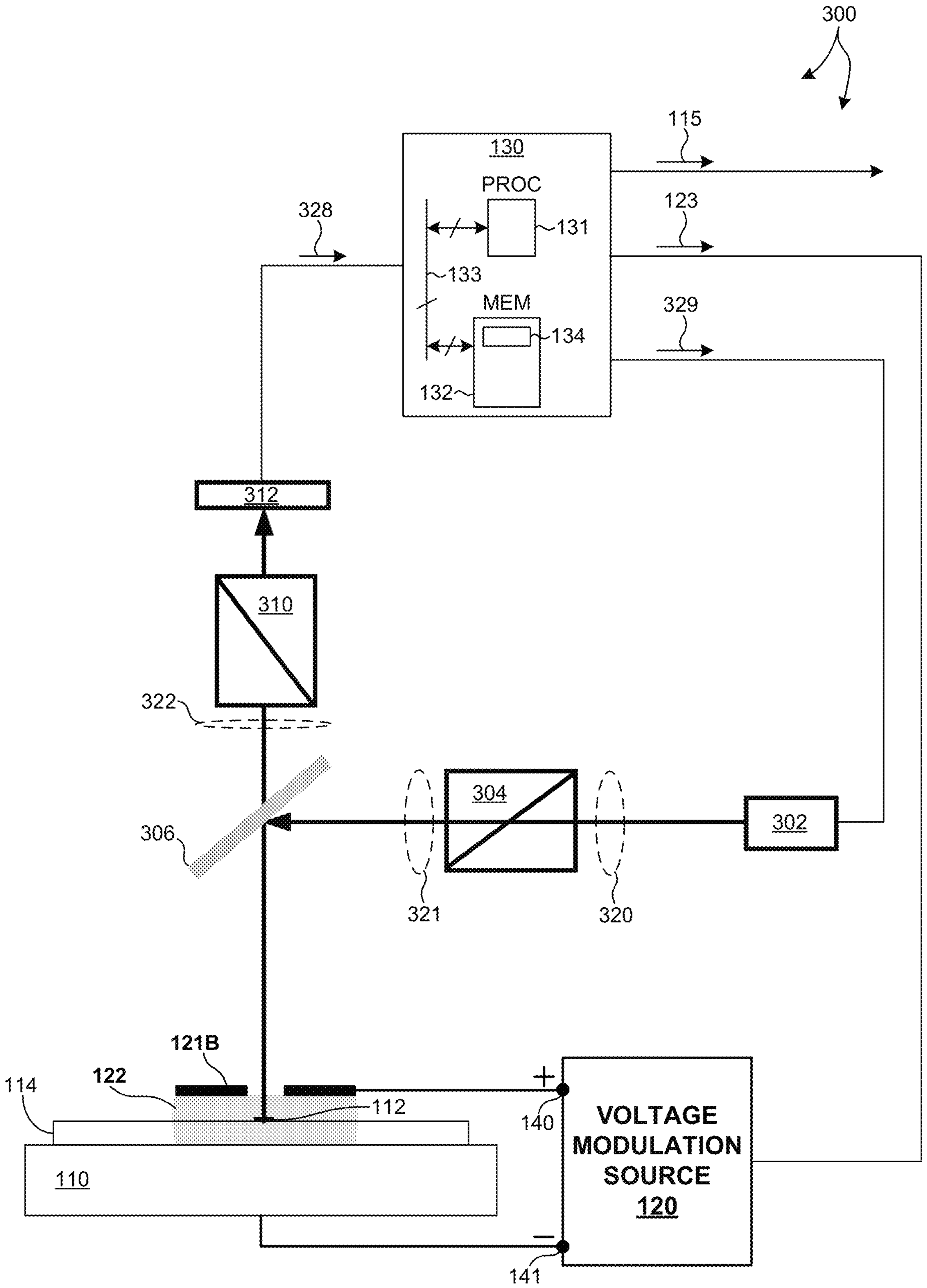
FIG. 3 is a diagram illustrative of a system 300 for performing spectroscopic reflectometry measurements of one or more structures disposed on a semiconductor wafer while modulating an electric field within the one or more structures under measurement.

FIG. 3 illustrates a spectral reflectometer system configured to measure reflectivity at normal incidence to estimate values of one or more characteristics of a semiconductor wafer in at least one novel aspect. Like numbered elements illustrated in FIG. 3 are analogous to those described with reference to FIG. 1. As shown in FIG. 3, system 300 performs spectroscopic reflectometry measurements of one or more structures 112 disposed on a semiconductor wafer 114 while modulating an electric field within the one or more structures under measurement.

Spectroscopic reflectometer 300 includes polarizer 304, analyzer 310, and spectrometer 312. As depicted in FIG. 3, an illumination beam is generated by the illumination source 302 in response to command signals 329 received from computing system 130. Illumination light beam 320 from illumination source 302 is directed to polarizer 304. Although, as depicted, illumination light directed to polarizer 304 comes from illumination source 302, in general, light from any number of illumination sources of system 300 may be combined to generate an illumination light beam directed to polarizer 304. In this manner, the spectral components of the illumination light can be configured as a combination of light emitted from multiple illumination sources.

In some embodiments, polarizer 304 is configured to selectively rotate a polarizing element about the optical axis of the illumination light beam 320. In general, polarizer 304 may include any polarizing element and system to rotate the polarizing element known in the art. For example, the polarizer 304 may include a polarizing element mechanically coupled to a rotational actuator. In one example, the polarizing element may be a Rochon prism. In another example, the polarizing element may include a beam displacer. Polarizer 304 is configured to operate within system 300 in either a rotationally active or rotationally inactive state. In one instance, a rotational actuator of polarizer 304 may be inactive such that the polarizing element remains rotationally fixed about the optical axis of illumination light 320. In another instance, the rotational actuator may rotate the polarizing element at a selected angular frequency, $\omega_p$, about the optical axis of the illumination light.

In some other embodiments, polarizer 304 is configured with a fixed polarization angle about the optical axis of the illumination light beam 320.

As depicted in FIG. 3, illumination light beam 320 passes through polarizer 304 while the rotational actuator rotates the polarizing element at the selected angular frequency, $\omega_p$. In this manner, polarizer 304 generates a polarized light beam 321 directed toward beamsplitter 306. Beamsplitter 306 directs the polarized light beam 321 towards wafer 114 at normal incidence. The polarized light beam 221 is incident onto the surface of wafer 114 over a small illumination spot, e.g., less than 100 micrometers in diameter.

The interaction of the polarized light beam 321 with wafer 114 modifies the polarization of the radiation by any of reflection, scattering, diffraction, transmission, or other types of processes. After interaction with the wafer 114, modified light 322 is directed to beamsplitter 306. Beamsplitter 306 is configured to transmit modified light 322 toward analyzer 310. In the embodiment depicted in FIG. 3, analyzer 310 includes a polarizer element that remains rotationally fixed about the optical axis of modified light beam 322 while the modified light beam 322 passes through the analyzer 310 to spectrometer 312. In spectrometer 312, the beam components having different wavelengths are refracted (e.g., in a prism spectrometer) or diffracted (e.g., in a grating spectrometer) in different directions to different detectors. The detectors may be a linear array of photodiodes, with each photodiode measuring radiation in a different wavelength range. The radiation received by the spectrometer 312 is analyzed with regard to polarization state, allowing for spectral analysis by the spectrometer of radiation passed by the polarizer 312. The measured spectra 328 are communicated to computing system 130. Computing system 130 is configured to receive signals 328 indicative of the measured spectral response of the structure of interest and estimate values of parameters of interest based on the measured spectral response.

As depicted in FIG. 3, metrology system 300 includes an electric field modulation subsystem configured to generate a modulated electric field within a volume that includes one or more structures 312 under measurement by spectroscopic reflectometer system 300 as described with respect to spectroscopic ellipsometer system 100 hereinbefore.

Although reflectometer systems 200 and 300 include polarization optics, in general, reflectometer system 200 and 300 may not include polarization optics.

In general, the electrode of an electric field modulation subsystem facing the top surface of a wafer may be shaped in any suitable manner to avoid optically interfering with the propagation of the illumination and collection light of the measurement system.

In some embodiments, the top electrode is fabricated entirely, or in part, with an optically transparent, electrically conductive material. In these embodiments, the top electrode may be located in the optical path of the measurement system.

In some other embodiments, the top electrode is fabricated with an electrically conductive material, but is not located in the optical path of the measurement system. For example, electrode 121A depicted in FIG. 1 is located close to the surface of wafer 114, but outside the optical path of illumination beam 106 and collection beam 108. This embodiment is suitable for spectroscopic systems operating with large angles of incidence, e.g., spectroscopic systems operating close to the Brewster's angle of wafer 114.

Figure 5:
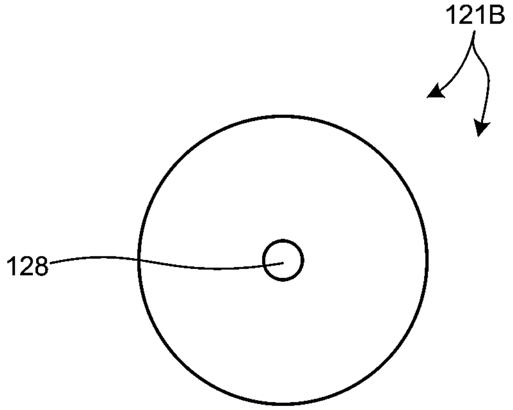
FIG. 5 is a diagram illustrative of a top view of an electrode having an aperture through which an illumination beam and a collection beam pass without optical interference.

In some other embodiments, the top electrode is fabricated with an electrically conductive material and includes an aperture through which the illumination and collection light passes without interference. For example, electrode 121B depicted in FIG. 2 is located close to the surface of wafer 114, but outside the optical path of illumination beam 221 and collection beam 222. This embodiment is suitable for spectroscopic systems operating with smaller angles of incidence, e.g., spectroscopic systems operating closer to normal incidence. FIG. 5 depicts a top view of electrode 121B illustrating aperture 128 through which illumination beam 221 and collection beam 222 pass without optical interference. Although aperture 128 is depicted as circular, in general, any suitable shape may be employed, e.g., elliptical, rectangular, etc.

Figure 4:
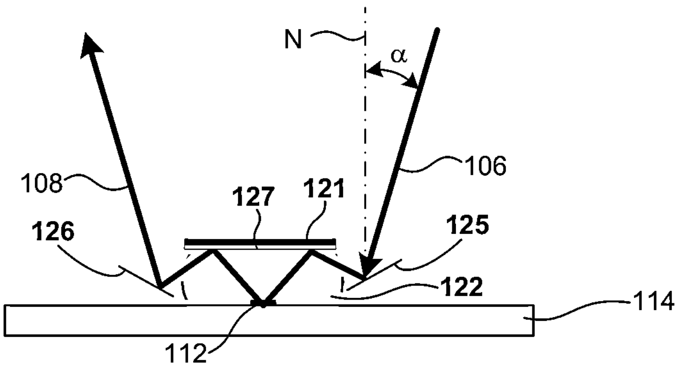
FIG. 4 is a diagram illustrative of an electrode including a highly reflective surface facing the top surface of a wafer under measurement.

In some other embodiments, the top electrode is fabricated with an electrically conductive material and includes a reflective surface facing the top surface of wafer 114. Illumination and collection light reflect from the reflective surface while propagating to and from the surface of wafer 114. FIG. 4 depicts a top electrode 121 including a highly reflective surface 127 facing the top surface of wafer 114. Illumination light 106 is incident on a surface of mirror 125, which redirects illumination light 106 to highly reflective surface 127. The illumination light 106 reflects from highly reflective surface 127 of top electrode 121 and is incident on the surface of wafer 114. Light 108 from the surface of wafer 114 reflects from highly reflective surface 127 of top electrode 121 to mirror 126, and in turn, reflects from mirror 126 toward the remainder of the collection path of the measurement system. As depicted in FIG. 4, a top electrode having a larger surface area is enabled by reflecting light from the bottom surface of the electrode. This embodiment is suitable for spectroscopic systems operating with small angles of incidence, large angles of incidence, or both.

In general, a measurement system may include any combination of spectroscopic ellipsometry measurements, spectral reflectometry measurements, and angle resolved spectral reflectometry measurements employing an electric field modulation subsystem. The measurements may be performed sequentially or simultaneously.

Figure 6:
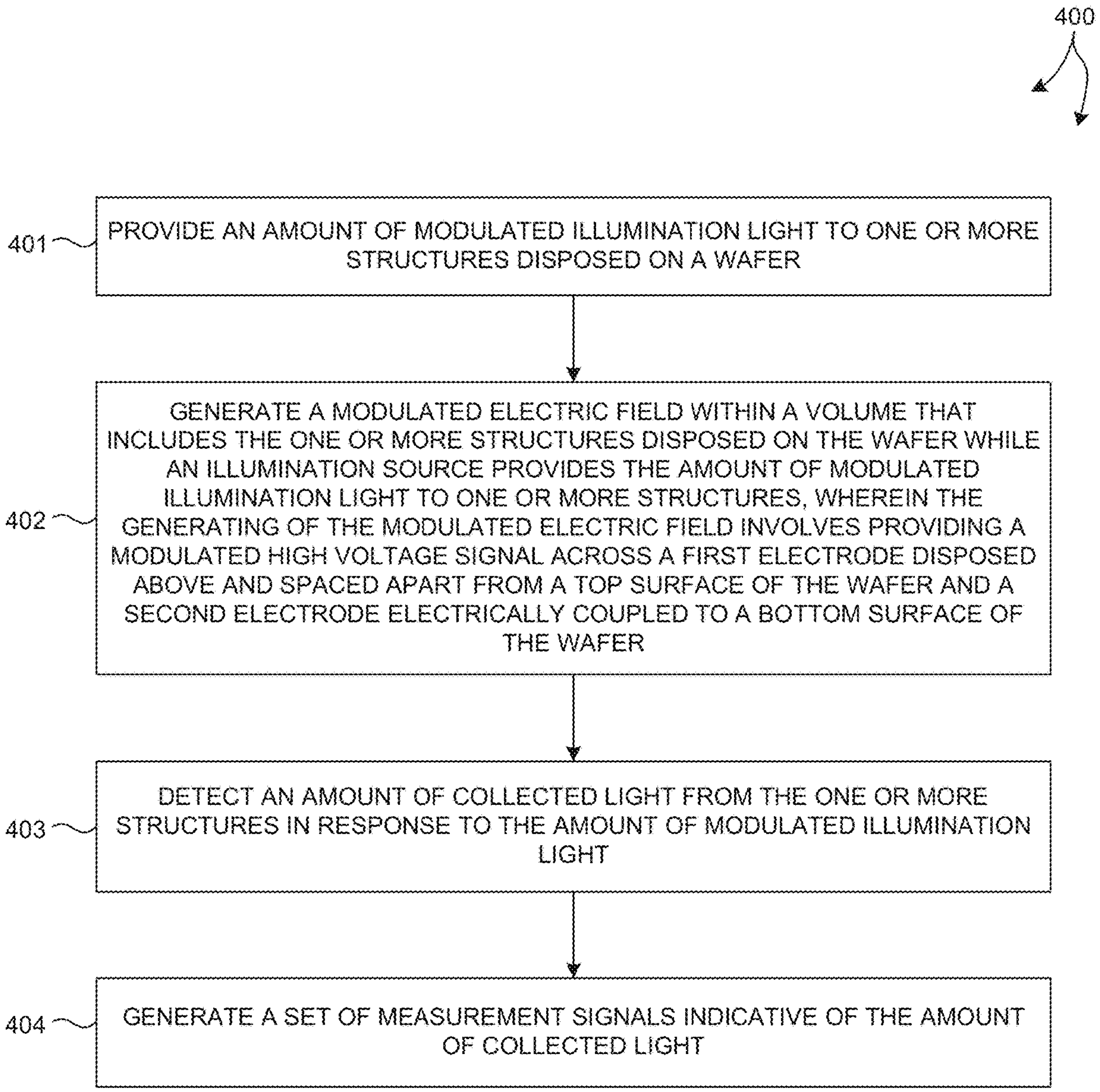
FIG. 6 is a flowchart illustrative of a method for performing optical measurements of semiconductor structures while modulating both an electric field within one or more structures under measurement and the measurement light.

FIG. 6 illustrates a method 400 for performing optical measurements of semiconductor structures while modulating both an electric field within one or more structures under measurement and the measurement light. Method 400 is suitable for implementation by a metrology system such as metrology systems 100, 200, and 300 illustrated in FIGS. 1-3, respectively, of the present invention. In one aspect, it is recognized that data processing blocks of method 400 may be carried out via a pre-programmed algorithm executed by one or more processors of computing system 130, or any other general purpose computing system. It is recognized herein that the particular structural aspects of metrology systems 100, 200, and 300 do not represent limitations and should be interpreted as illustrative only.

In block 401, an amount of modulated illumination light is provided to one or more structures disposed on a wafer.

In block 402, a modulated electric field is generated within a volume that includes the one or more structures disposed on the wafer while an illumination source provides the amount of modulated illumination light to the one or more structures under measurement. The generating of the modulated electric field involves providing a modulated high voltage signal across a first electrode disposed above and spaced apart from a top surface of the wafer and a second electrode electrically coupled to a bottom surface of the wafer.

In block 403, an amount of collected light from the one or more structures is detected in response to the amount of modulated illumination light.

In block 404, a set of measurement signals is generated that is indicative of the amount of collected light.

In the embodiments depicted in FIGS. 1-3, measurements of one or more structures are performed while inducing a time varying electric field in the structures under measurement. In general, any suitable model-based or modeless metrology technique may be employed to perform measurements of structures subject to a time varying electric field in accordance with the methods and systems described herein.

Suitable metrology techniques include, but are not limited to, spectroscopic ellipsometry and spectroscopic reflectometry, including single wavelength, multiple wavelength, and angle resolved implementations, spectroscopic scatterometry, scatterometry overlay, beam profile reflectometry and beam profile ellipsometry, including angle-resolved and polarization-resolved implementations may be contemplated, individually, or in any combination.

In general, the aforementioned measurement techniques may be applied to the measurement of process parameters, structural parameters, layout parameters, dispersion parameters, or any combination thereof. By way of non-limiting example, overlay, profile geometry parameters (e.g., critical dimension, height, sidewall angle), process parameters (e.g., lithography focus, and lithography dose), dispersion parameters, layout parameters (e.g., pitch walk, edge placement errors), film thickness, composition parameters, or any combination of parameters may be measured using the aforementioned techniques.

By way of non-limiting example, the structures measured with shape filling include gate all around structures, line-space grating structures, FinFet structures, SRAM device structures, Flash memory structures, and DRAM memory structures.

In another further aspect, the structures under measurement may be design rule targets. In other words, the metrology targets adhere to the design rules applicable to the underlying semiconductor manufacturing process. In some examples, the metrology targets are preferably located within the active die area. In some examples, the metrology targets have dimensions of 15 micrometers by 15 micrometers, or smaller. In some other examples, the metrology targets are located in the scribe lines, or otherwise outside the active die area.

In some examples, measurements are performed with electric field modulation to estimate one parameter of interest. Thus, the measurement model associated with the parameter of interest is optimized independently. By measuring each parameter of interest individually, the computational burden is reduced and the performance of the underlying measurement can be maximized by selecting different wavelengths, measurement subsystems, and measurement methods that are optimized for each individual parameter. In addition, different measurement solvers can be selected, or configured differently, for each parameter of interest.

However, in some other examples, measurements are performed with electric field modulation to estimate multiple parameters of interest in parallel. Thus, the measurement model is developed to solve for multiple parameters of interest.

In some examples, measurements of parameters of interest performed at a particular measurement site rely on data collected from that particular measurement site only, even though data may be collected from multiple sites on the wafer. In some other examples, measurement data collected from multiple sites across the wafer, or a subset of the wafer is used for measurement analysis. This may be desirable to capture parameter variations across the wafer.

In some examples, measurements of parameters of interest are performed based on metrology targets with multiple, different measurement techniques including single target techniques, multi-target techniques and spectra feedforward techniques. Accuracy of measured parameters may be improved by any combination of feed sideways analysis, feed forward analysis, and parallel analysis. Feed sideways analysis refers to taking multiple data sets on different areas of the same specimen and passing common parameters determined from the first dataset onto the second dataset for analysis. Feed forward analysis refers to taking data sets on different specimens and passing common parameters forward to subsequent analyses using a stepwise copy exact parameter feed forward approach. Parallel analysis refers to the parallel or concurrent application of a non-linear fitting methodology to multiple datasets where at least one common parameter is coupled during the fitting.

Multiple tool and structure analysis refers to a feed forward, feed sideways, or parallel analysis based on regression, a look-up table (i.e., "library" matching), or another fitting procedure of multiple datasets. Exemplary methods and systems for multiple tool and structure analysis is described in U.S. Pat. No. 7,478,019, issued on Jan. 13, 2009, to KLA-Tencor Corp., the entirety of which is incorporated herein by reference.

In yet another aspect, the measurement results obtained as described herein can be used to provide active feedback to a process tool (e.g., lithography tool, etch tool, deposition tool, etc.). For example, values of critical dimensions determined using the methods and systems described herein can be communicated to a lithography tool to adjust the lithography system to achieve a desired output. In a similar way etch parameters (e.g., etch time, diffusivity, etc.) or deposition parameters (e.g., time, concentration, etc.) may be included in a measurement model to provide active feedback to etch tools or deposition tools, respectively. In some example, corrections to process parameters determined based on measured device parameter values may be communicated to a lithography tool, etch tool, or deposition tool.

It should be recognized that the various steps described throughout the present disclosure may be carried out by a single computer system 130, a multiple computer system 130, or multiple, different computer systems 130. Moreover, different subsystems of systems 100, 200, and 300, such as the electric field modulation subsystem, may include a computer system suitable for carrying out at least a portion of the steps described herein. Therefore, the aforementioned description should not be interpreted as a limitation on the present invention but merely an illustration. Further, computing system 130 may be configured to perform any other step(s) of any of the method embodiments described herein.

The computing system 130 may include, but is not limited to, a personal computer system, mainframe computer system, workstation, image computer, parallel processor, or any other device known in the art. In general, the term "computing system" may be broadly defined to encompass any device, or combination of devices, having one or more processors, which execute instructions from a memory medium. In general, computing system 130 may be integrated with a measurement system such as measurement systems 100, 200, and 300, or alternatively, may be separate, entirely, or in part, from any measurement system. In this sense, computing system 130 may be remotely located and receive measurement data and from any measurement source and transmit command signals to any element of metrology systems 100, 200, and 300.

Program instructions 134 implementing methods such as those described herein may be transmitted over a transmission medium such as a wire, cable, or wireless transmission link. For example, as illustrated in FIG. 1, program instructions 134 stored in memory 132 are transmitted to processor 131 over bus 133. Memory 132 storing program instructions 134 may include a computer-readable medium such as a read-only memory, a random access memory, a magnetic or optical disk, or a magnetic tape.

In addition, the computing system 130 may be communicatively coupled to elements of measurement systems 100, 200, and 300 in any manner known in the art.

The computing system 130 may be configured to receive and/or acquire data or information from subsystems of a measurement system (e.g., spectrometer 104, illuminator 102, the electric field modulation subsystem, and the like) by a transmission medium that may include wireline and/or wireless portions. In this manner, the transmission medium may serve as a data link between the computer system 130 and other subsystems of systems 100, 200, and 300. Further, the computing system 130 may be configured to receive measurement data via a storage medium (i.e., memory). For instance, the spectral results obtained using a spectrometer of ellipsometer 101 may be stored in a permanent or semi-permanent memory device (not shown). In this regard, the spectral results may be imported from an external system. Moreover, the computer system 130 may receive data from external systems via a transmission medium.

The computing system 130 may be configured to transmit data or information to subsystems of the system (e.g., spectrometer 104, illuminator 102, an electric field modulation subsystem, and the like) by a transmission medium that may include wireline and/or wireless portions. In this manner, the transmission medium may serve as a data link between the computer system 130 and other subsystems of the systems 100, 200, and 300. Further, the computing system 130 may be configured to transmit command signals and measurement results via a storage medium (i.e., memory). For instance, the measurement results 115 obtained by analysis of spectral data may be stored in a permanent or semi-permanent memory device (not shown). In this regard, the spectral results may be exported to an external system. Moreover, the computer system 130 may send data to external systems via a transmission medium. In addition, the determined values of the parameter of interest are stored in a memory. For example, the values may be stored on-board the measurement systems 100, 200, and 300, for example, in memory 132, or may be communicated (e.g., via output signal 115) to an external memory device.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including measurement applications such as critical dimension metrology, overlay metrology, focus/dosage metrology, and composition metrology. However, such terms of art do not limit the scope of the term "metrology system" as described herein. In addition, the metrology system 100 may be configured for measurement of patterned wafers and/or unpatterned wafers. The metrology system may be configured as an inspection tool such as a LED inspection tool, edge inspection tool, backside inspection tool, macro-inspection tool, or multi-mode inspection tool (involving data from one or more platforms simultaneously), and any other metrology or inspection tool that benefits from the calibration of system parameters based on critical dimension data. For purposes of this patent document, the terms "metrology" system and "inspection" system are synonymous.

Various embodiments are described herein for a semiconductor processing system (e.g., an inspection system or a lithography system) that may be used for processing a specimen. The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A measurement system comprising:

an electric field modulation subsystem including, a first electrode disposed above and spaced apart from a top surface of a wafer;

a second electrode electrically coupled to a bottom surface of the wafer; and a modulated high voltage source electrically coupled to the first and second electrodes, the modulated high voltage source configured to provide a modulated high voltage signal across the first and second electrodes, wherein an amplitude of the modulated high voltage signal is at least 1 kilovolt, wherein the modulated high voltage signal generates a modulated electric field between the first and second electrodes within a volume that includes one or more structures disposed on the wafer;

an illumination source configured to provide an amount of illumination light to the one or more structures while the electric field modulation subsystem generates the modulated electric field between the first and second electrodes;

a detector configured to receive an amount of collected light from the one or more structures in response to the amount of illumination light and generate a set of measurement signals indicative of the amount of collected light;

an optical modulation element disposed in an optical path from the illumination source to the detector, wherein a frequency of optical modulation of the amount of illumination light, the amount of collected light, or both, is different from a frequency of the modulated electric field; and a computing system configured to:

receive the set of measurement signals associated with a measurement of the one or more structures; and estimate a value of a parameter of interest of the one or more structures based on the set of measurement signals.

2. The measurement system of claim 1, wherein the one of more structures includes a Gate All Around (GAA) structure.

3. The measurement system of claim 1, wherein the parameter of interest is any of a critical dimension, a film thickness, a material concentration, and a material composition.

4. The measurement system of claim 1, wherein the measurement is any of a spectroscopic ellipsometry measurement, a spectroscopic reflectometry measurement, an angle resolved spectroscopic reflectometry measurement, or any combination thereof.

5. The measurement system of claim 1, wherein the amount of illumination light includes wavelengths in a range between 120 nanometers and 20 micrometers.

6. The measurement system of claim 1, wherein the second electrode is a wafer chuck in mechanical and electrical contact with the wafer.

7. The measurement system of claim 1, wherein the first electrode is disposed above the wafer by a distance less than 10 millimeters.

8. The measurement system of claim 1, wherein a modulation frequency of the modulated electric field is in a range between 1 Hertz and 1000 Hertz.

9. The measurement system of claim 1, wherein an amplitude of the modulated high voltage signal is in a range between 1 kilovolt and 100 kilovolts.

10. The measurement system of claim 9, wherein the modulated high voltage signal includes a single modulation frequency.

11. The measurement system of claim 9, wherein the modulated high voltage signal includes multiple modulation frequencies.

12. The measurement system of claim 1, wherein the first electrode includes a transparent, electrically conductive material, wherein the illumination light is transmitted through the transparent, electrically conductive material.

13. The measurement system of claim 1, wherein the first electrode includes a reflective surface, wherein the illumination light is reflected by the reflective surface.

14. The measurement system of claim 1, wherein the first electrode includes an aperture, wherein the illumination light passes through the aperture.

15. The measurement system of claim 1, wherein the optical modulation element includes a rotating polarizer element, a rotating compensator element, or both.

16. The measurement system of claim 1, wherein a difference between the frequency of optical modulation and a resonant frequency of a band structure of the one or more structures under measurement is less than 20% of a value of the resonant frequency of the band structure, and wherein a difference between the frequency of the modulated electric field and the resonant frequency of the band structure of the one or more structures under measurement is less than 20% of the value of the resonant frequency of the band structure.

17. A metrology system, comprising:

an illumination source configured to provide an amount of modulated illumination light to one or more structures disposed on a wafer;

a detector configured to receive an amount of collected light from the one or more structures in response to the amount of modulated illumination light and generate a set of measurement signals indicative of the amount of collected light;

an electric field modulation subsystem including, a first electrode disposed above and spaced apart from a top surface of a wafer;

a second electrode electrically coupled to a bottom surface of the wafer; and a modulated high voltage source electrically coupled to the first and second electrodes, the modulated high voltage source configured to provide a modulated high voltage signal across the first and second electrodes, wherein an amplitude of the modulated high voltage signal is at least 1 kilovolt, wherein the modulated high voltage signal generates a modulated electric field between the first and second electrodes within a volume that includes the one or more structures disposed on the wafer while the illumination source provides the amount of modulated illumination light to the one or more structures.

18. The metrology system of claim 17, wherein the one of more structures includes a Gate All Around (GAA) structure.

19. The metrology system of claim 17, wherein the measurement is any of a spectroscopic ellipsometry measurement, a spectroscopic reflectometry measurement, an angle resolved spectroscopic reflectometry measurement, or any combination thereof.

20. The metrology system of claim 17, wherein the first electrode includes a transparent, electrically conductive material, wherein the illumination light is transmitted through the transparent, electrically conductive material.

21. The metrology system of claim 17, wherein the first electrode includes a reflective surface, wherein the illumination light is reflected by the reflective surface.

22. The metrology system of claim 17, wherein the first electrode includes an aperture, wherein the illumination light passes through the aperture.

23. The metrology system of claim 17, wherein a difference between a frequency of optical modulation and a resonant frequency of a band structure of the one or more structures under measurement is less than 20% of a value of the resonant frequency of the band structure, and wherein a difference between a frequency of the modulated electric field and the resonant frequency of the band structure of the one or more structures under measurement is less than 20% of the value of the resonant frequency of the band structure.

24. A method comprising:

providing an amount of modulated illumination light to one or more structures disposed on a wafer;

generating a modulated electric field within a volume that includes the one or more structures disposed on the wafer while an illumination source provides the amount of modulated illumination light to one or more structures, wherein the generating of the modulated electric field involves providing a modulated high voltage signal across a first electrode disposed above and spaced apart from a top surface of the wafer and a second electrode electrically coupled to a bottom surface of the wafer, wherein an amplitude of the modulated high voltage signal is at least 1 kilovolt;

detecting an amount of collected light from the one or more structures in response to the amount of modulated illumination light; and generating a set of measurement signals indicative of the amount of collected light.

25. The method of claim 24, wherein a difference between a frequency of optical modulation and a resonant frequency of a band structure of the one or more structures under measurement is less than 20% of a value of the resonant frequency of the band structure, and wherein a difference between a frequency of the modulated electric field and the resonant frequency of the band structure of the one or more structures under measurement is less than 20% of the value of the resonant frequency of the band structure.

* * * * *